(12) United States Patent
Hsiung

(10) Patent No.: US 6,828,590 B2
(45) Date of Patent: Dec. 7, 2004

(54) LIGHT EMITTING DIODE MODULE DEVICE

(76) Inventor: Bear Hsiung, 5F, No. 30, Lane 179, Sec. 2, Nei Hu Rd., Nei-Hu, Taipei (TW)

( * ) Notice: Subject to any disclaimer, the term of this patent is extended or adjusted under 35 U.S.C. 154(b) by 30 days.

(21) Appl. No.: 10/430,400

(22) Filed: May 7, 2003

(65) Prior Publication Data

US 2004/0222427 A1 Nov. 11, 2004

(51) Int. Cl.[7] .............................................. H01L 27/15
(52) U.S. Cl. .............................. 257/79; 357/98; 357/99; 357/100; 362/231; 362/249; 313/498; 313/512
(58) Field of Search ........................... 257/98, 99, 100; 362/231, 249; 313/512, 498

(56) References Cited

U.S. PATENT DOCUMENTS 6,060,729 A * 5/2000 Suzuki et al. ................. 257/99

OTHER PUBLICATIONS

Hsiung Chen et al., Display Module, Jan. 30, 2003, Patent Application Publication US2003/0020400.*

* cited by examiner

Primary Examiner—David Nelms
Assistant Examiner—Mai-Huong Tran
(74) Attorney, Agent, or Firm—Browdy and Neimark, P.L.L.C.

(57) ABSTRACT

An LED module device at least HAS a circuit board, an LED chip and a conductive sheet. The circuit board has a groove. The conductive sheet is made of metal material having good electric and heat conductance effects, and is disposed below the circuit board. The LED chip is received in the groove. The lower side of the LED chip is electrically connected to the upper side of the conductive sheet. The upper side of the LED chip is electrically connected to the upper side of the circuit board with a lead. A gel covers the LED chip. The LED module device has the advantages of high brightness, better heat-radiating efficiency, convenient assembly and simplified fabrication process.

6 Claims, 4 Drawing Sheets

LIGHT EMITTING DIODE MODULE DEVICE

BACKGROUND OF THE INVENTION

1. Field of the Invention

The present invention relates to a light emitting diode module device and, more particularly, to a light emitting diode module device having high brightness, better heat-radiating efficiency, convenient assembly and a simplified fabrication process.

2. Description of the Related Art

A light emitting diode (LED) is an electronic component made of single crystal semiconductor material. Presently, red and green LEDs of the three primary colors are mass-produced. Because of high reliability, simple control of ON and OFF states of light emission point, and capability of displaying digit and text with segments, LEDs have broad and convenient applications, and have gradually replaced conventional illumination light sources. However, for a conventional LED to meet the requirement of high brightness, a larger current is required, hence easily causing and increase of temperature and a problem of heat radiation.

FIG. 1 shows a conventional LED, wherein a bowl 91 is formed on a circuit board 90 having an anode circuit and a cathode circuit. An LED chip 92 is disposed in the bowl 91. The LED chip 92 is connected to the anode circuit or the cathode circuit with a lead. A gel 94 covers the LED chip 92. The circuit board 90 is a nonconductive base layer 901 with a circuit board 902 for forming the anode circuit and cathode circuit disposed thereon. A conductive layer 903 capable of the connection of pins to the circuit layer 902 is disposed below the base layer 901. For this conventional LED, heat generated by the LED chip 92 cannot be quickly transferred to the conductive layer 903, hence resulting in an inferior heat-radiating efficiency. The LED chip 92 will thus easily burn out. Moreover, both the anode circuit and cathode circuit of the circuit layer 902 are disposed above the circuit board 90, so it is necessary for two pins 95 and 96 to pass through the circuit board 90 and protrude therebelow, hence resulting in inconvenient assembly and complicating the fabrication process.

Accordingly, the above conventional LED has inconveniences and drawbacks in practical fabrication and use. The present invention aims to solve the problems in the prior art.

SUMMARY OF THE INVENTION

The primary object of the present invention is to provide an LED module device, wherein an LED chip is directly disposed on a conductive sheet having good electric and heat conductance effects. Heat generated by the LED chip can thus be quickly transferred to the conductive sheet to assist in radiating heat, hence having a better heat-radiating efficiency. Therefore, the LED chip can stably exploit its high brightness characteristic and will not burn out.

Another object of the present invention is to provide an LED module device, whose wires need not pass through a circuit board, hence accomplishing a more convenient assembly and simplifying the fabrication process.

To achieve the above objects, the present invention provides an LED module device, which comprises a circuit board, a conductive sheet and an LED chip. The circuit board has a groove. The conductive sheet is disposed below the circuit board. The LED chip is received in the groove. The lower side of the LED chip is electrically connected with the upper side of the conductive sheet. The upper side of the LED chip is electrically connected to the upper side of the circuit board with a lead. A gel covers the LED chip.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENT

Figure 1:
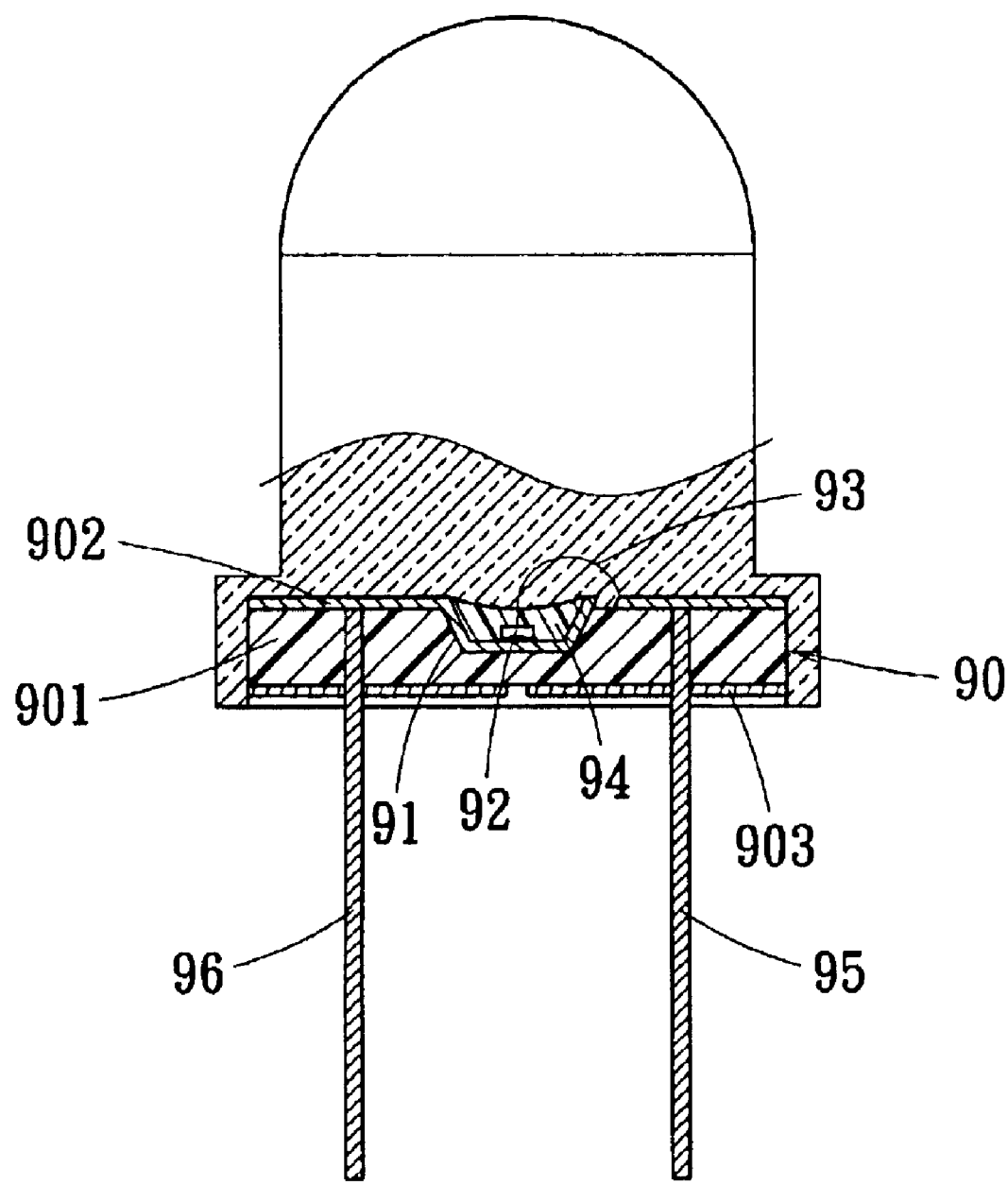
FIG. 1 is a cross-sectional view of a conventional LED.
Figure 2:
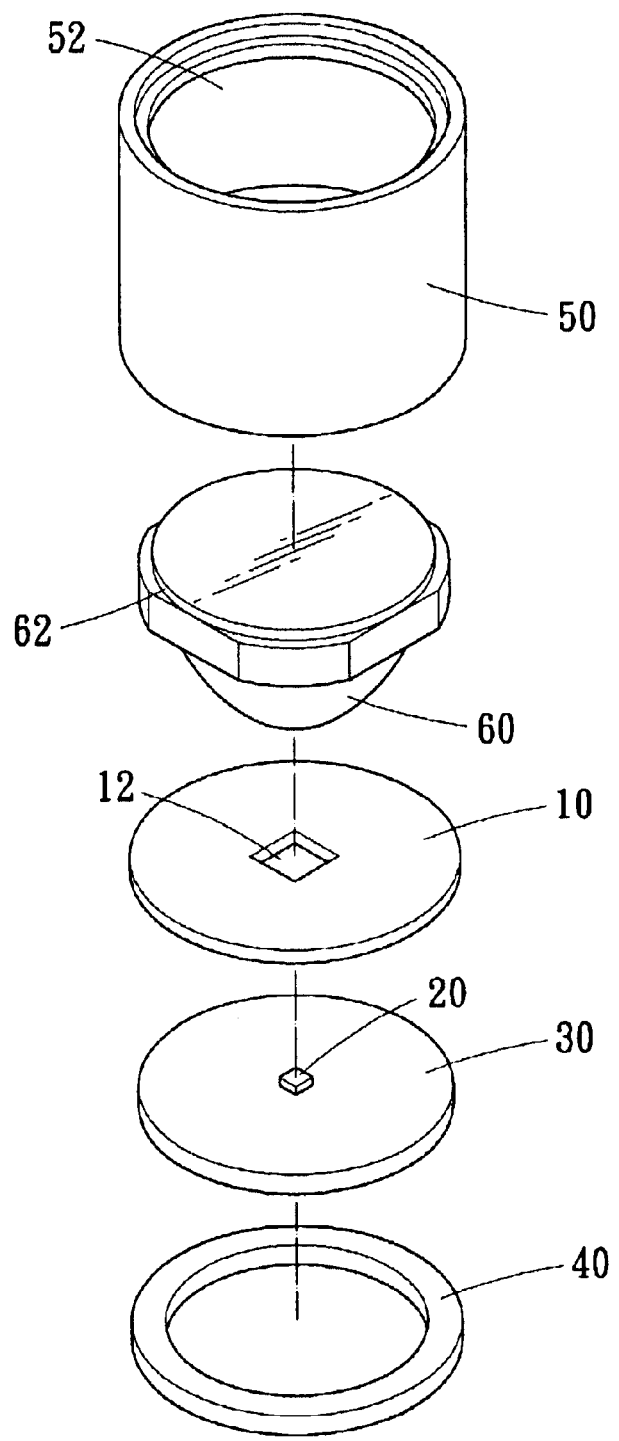
FIG. 2 is an exploded perspective view of the present invention.
Figure 3:
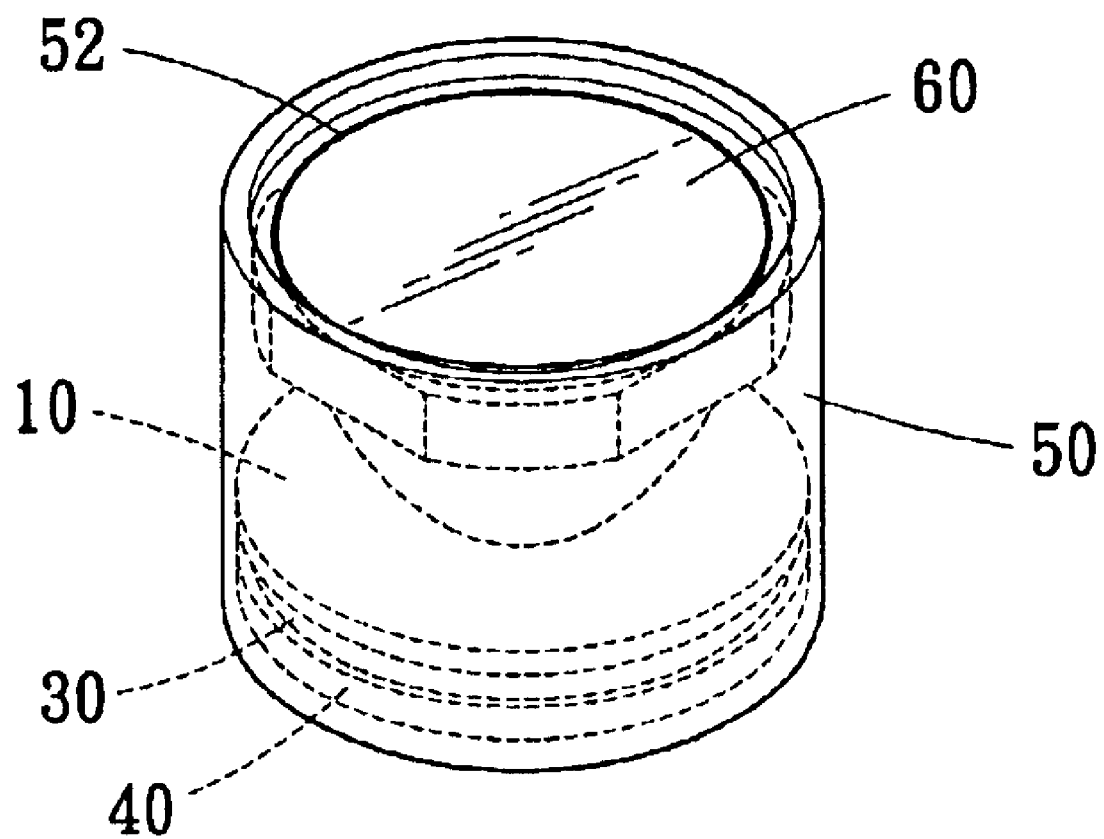
FIG. 3 is a perspective assembly view of the present invention.
Figure 4:
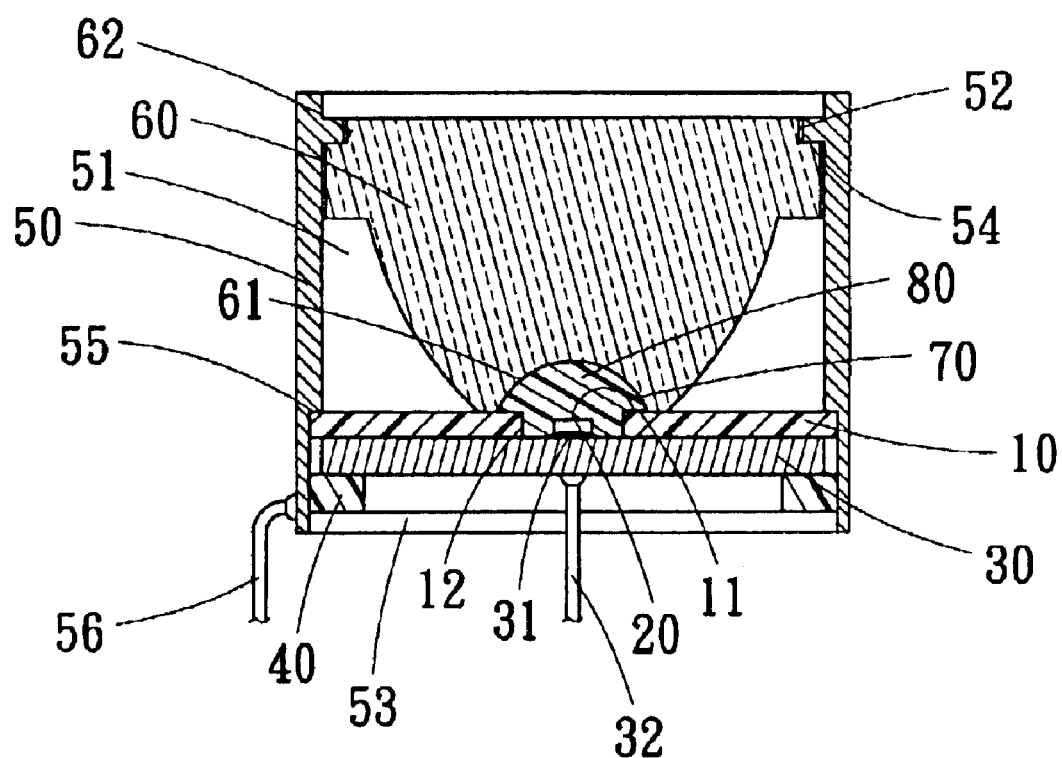
FIG. 4 is a cross-sectional view of the present invention.

As shown in FIGS. 2, 3 and 4, an LED module device of the present invention comprises a circuit board 10, an LED chip 20, a conductive sheet 30, an insulator 40, a housing 50 and a focusing component 60. A cathode circuit 11 is provided on the upper side of the circuit board (printed circuit board) 10. A groove 12 is disposed on the circuit board 10. The LED chip 20 is a high-brightness chip received in the groove 12.

The conductive sheet 30 is made of metal material having good electric and heat conductance effects like copper. The conductive sheet 30 is disposed below the circuit board 10, and has an area smaller than that of the circuit board 10. That is, the outer edge of the conductive sheet 30 shrinks more inwards than that of the circuit board 10 to avoid contact between the outer edge of the conductive sheet 30 and the inner edge of the housing 50, which would cause a short circuit.

The lower side (anode) of the LED chip 20 is electrically connected to the upper side of the conductive sheet 30 with a conductive gel (e.g., silver gel) 31. The upper side (cathode) of the LED chip 20 is electrically connected to the cathode circuit 11 on the upper side of the circuit board 10 with a lead 70. A gel 80 covers the LED chip 20.

The insulator 40 is made of insulating material like ceramic, and is ring-shaped. The insulator 40 can also be made by adding an insulating sheet (not shown) onto a metal ring. The insulator 40 is disposed below the conductive sheet 30.

The housing 50 is made of metal material having good electric and heat conductance effects like copper. The housing 50 is hollow with a receiving space 51 formed therein. The upper and lower ends of the receiving space 51 form a first opening 52 and a second opening 53, respectively. The internal diameter of the first opening 52 is smaller than that of the receiving space 51 to allow the upper edge of the receiving space 51 to form a ring-shaped first stop edge 54. The internal diameter of the second opening 53 is larger than that of the receiving space 51 to allow the lower edge of the receiving space 51 to form a ring-shaped second stop edge 55.

The circuit board 10, the conductive sheet 30 and the insulator 40 are received in the second opening 53 of the housing 50. The circuit board 10 can abut the second stop edge 55 for positioning. The insulator 40 and the housing 50 can be riveted together to firmly position the circuit board 10, the conductive sheet 30 and the insulator 40. The outer edge of the cathode circuit 11 of the circuit board 10 contacts the housing 50 to achieve electric connection The upper side of the LED chip 20, the lead 70, the circuit board 10 and the housing 50 can thus achieve electric connection so that electricity can be input to the LED chip 20.

The focusing component 60 is made of transparent material like acrylic. The focusing component 60 is disposed in the receiving space 51 of the housing 50. The focusing component 60 is located above the LED chip 20. A cavity 61 corresponding to the gel 80 and the LED chip 20 is disposed at the lower end of the focusing component 60. The upper end of the focusing component 60 abuts the first stop edge 54 for positioning. A flange 62 is disposed at the upper end of the focusing component 60. The flange 62 abuts the inner edge of the first opening 52 of the housing 50 so that the focusing component 60 can be firmly positioned in the receiving space 51 of the housing 50. An LED module device of the present invention is thus formed.

When the present invention is in practical use, anode electricity can be input to the conductive sheet 30 and the lower side of the LED chip 20 with a connection wire 32, and cathode electricity can be input to the housing 50, the circuit board 10, the lead 70 and the upper side of the LED chip 20 with a connection wire 56, thereby driving the LED chip 20 to emit light. The light can be focused by the focusing component 60 and then be projected out. An LED module device of high brightness can thus be formed to display digits and texts or be used as an illumination light source.

In the present invention, the LED chip 20 is directly disposed on the conductive sheet 30 having good electric and heat conductance effects. Heat generated by the LED chip 20 can thus be quickly transferred to the conductive sheet 30 for assisting. in heat radiation, hence accomplishing a better heat-radiating efficiency. Therefore, the LED chip 20 can stably exploit its high-brightness characteristic and will not burn out. In other words, the problem of heat radiation of a high-brightness LED can be effectively solved.

Moreover, in the present invention, the cathode of the LED chip 20 is electrically connected to the cathode circuit 11 on the upper side of the circuit board 10, and the anode of the LED chip 20 is electrically connected with the conductive sheet 30 below the circuit board 10. That is, the cathode and anode circuits are located on different faces of the circuit board 10. The conductive sheet 30 located at the bottom can be used as an anode contact, while the housing located outside can be used as a cathode contact. Therefore, the connection wires 32 and 56 need not pass through the circuit board 10, hence accomplishing convenient assembly and simplifying the fabrication process.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A light emitting diode module device comprising:

a circuit board having a groove;

a conductive sheet disposed below said circuit board; and a light emitting diode chip received in said groove, a lower side of said light emitting diode chip being electrically connected to an upper side of said conductive sheet, an upper side of said light emitting diode chip being electrically connected with an upper side of said circuit board with a lead, and a gel covering said light emitting diode chip.

2. The light emitting diode module device as claimed in claim 1, wherein the upper side of said circuit board has a cathode circuit, and the upper side of said light emitting diode chip is electrically connected to said cathode circuit on the upper side of said circuit board with said lead.

3. The light emitting diode module device as claimed in claim 1, wherein said conductive sheet is made of metal material of good electric and heat conductance effects.

4. The light emitting diode module device as claimed in claim 1, wherein an area of said conductive sheet is smaller than that of said circuit board to allow the outer edge of said conductive sheet to shrink more inwards than that of said circuit board.

5. The light emitting diode module device as claimed in claim 1, wherein the lower side of said light emitting diode chip is electrically connected with the upper side of said conductive sheet with conducting gel.

6. The light emitting diode module device as claimed in claim 1 further comprising an insulator, a housing and a focusing component, said insulator being disposed below said conducive sheet, a receiving space being formed in said housing, two ends of said receiving space forming a first opening and a second opening, said circuit board, said conductive sheet and said insulator being received in said second opening of said housing, said insulator and said housing being joined together, said circuit board contacting said housing to achieve electric connection, said focusing component being disposed in said receiving space, and a cavity corresponding to said gel and said light emitting diode chip being disposed at a lower side of said focusing component.

* * * * *